US011195903B2

United States Patent
Lee et al.

(10) Patent No.: US 11,195,903 B2
(45) Date of Patent: Dec. 7, 2021

(54) HIGHLY STABLE ORGANIC LIGHT-EMITTING PANEL

(71) Applicant: Gu'an Yeolight Technology Co., Ltd, Langfang (CN)

(72) Inventors: Yu Lee, Hebei (CN); Yingguang Zhu, Hebei (CN); Jing Xie, Hebei (CN); Qianqian Yu, Hebei (CN); Lixue Guo, Hebei (CN); Yonglan Hu, Hebei (CN)

(73) Assignee: Gu'an Yeolight Technology Co., Ltd, Langfang (CN)

( * ) Notice: Subject to any disclaimer, the term of this patent is extended or adjusted under 35 U.S.C. 154(b) by 102 days.

(21) Appl. No.: 16/652,410

(22) PCT Filed: Dec. 25, 2018

(86) PCT No.: PCT/CN2018/123469
§ 371 (c)(1),
(2) Date: Mar. 30, 2020

(87) PCT Pub. No.: WO2020/024545
PCT Pub. Date: Feb. 6, 2020

(65) Prior Publication Data
US 2020/0286962 A1 Sep. 10, 2020

(30) Foreign Application Priority Data
Aug. 2, 2018 (CN) .......................... 201810873198.2

(51) Int. Cl.
*F21V 25/04* (2006.01)
*H01L 27/32* (2006.01)
*F21V 23/06* (2006.01)
*F21Y 115/15* (2016.01)

(52) U.S. Cl.
CPC ............ *H01L 27/329* (2013.01); *F21V 23/06* (2013.01); *F21V 25/04* (2013.01); *F21Y 2115/15* (2016.08)

(58) Field of Classification Search
None
See application file for complete search history.

(56) References Cited

U.S. PATENT DOCUMENTS

2015/0325809 A1* 11/2015 Yoshida ................. H05B 33/04
257/40
2016/0079313 A1* 3/2016 Ma ...................... H01L 27/3209
257/40
2017/0358632 A1* 12/2017 Ma ...................... H01L 51/5203

* cited by examiner

*Primary Examiner* — Anh Q Tran
(74) *Attorney, Agent, or Firm* — Liang Legal Group, PLLC

(57) ABSTRACT

A highly stable organic light-emitting panel includes a substrate and a plurality of pixelated OLED circuit assemblies. The substrate further includes an auxiliary electrode and a plurality of circuit protection structures, each of which is electrically connected to a corresponding pixelated first electrode in each pixelated OLED circuit assembly. The plurality of circuit protection structures are respectively connected to the auxiliary electrode. An insulator covers the auxiliary electrode, the plurality of circuit protection structures, and an area between the plurality of circuit protection structures and the plurality of OLED circuit assemblies. When a current passing through a pixel with short-circuit defect in any one of the plurality of OLED circuit assemblies is greater than a predetermined threshold of the circuit protection structure, the circuit protection structure corresponding to the pixel with short-circuit defect fuses, thereby isolating the OLED circuit assembly corresponding to the pixel with short-circuit defect.

20 Claims, 3 Drawing Sheets

HIGHLY STABLE ORGANIC LIGHT-EMITTING PANEL

TECHNICAL FIELD

The present invention relates to the technical field of OLED panel, in particular to a highly stable OLED panel.

BACKGROUND OF THE INVENTION

There are inevitably dust particles, burrs, pinholes, cracks and other defects in the manufacture process of OLED panels. The distance between the anode and cathode of an OLED panel is usually very small (about tens to hundreds of nanometers). As a result, the anode and cathode may come into direct contact and cause defects (called short-circuit points), or the organic layer between the anode and cathode may become thinner than in other portions. When an OLED device is in operation, the current tends to pass through the short-circuit points rather than other portions, causing heat accumulation at the short-circuit points, thus causing damage to the quality and reliability of the OLED device.

Under same conditions, the larger the illumination area of the OLED panel, the greater the possibility of occurrence of short-circuit point. It is possible to reduce the short-circuit points by increasing the thickness of the organic layer, but this requires higher driving voltage of the OLED device, thus affecting the device efficiency. Moreover, it cannot completely eliminate the short-circuit points. This problem may be solved by introducing a short-circuit prevention part.

In the prior art, the reliability of the device can be effectively increased by making a short-circuit prevention part by taking use of a structure or material. The design of the short-circuit prevention part mainly aims to generate certain impedance by making use of a material or geometric structure. The theoretical formula of impedance is as follows:

$$I_s = I_t \times \frac{(R_{cell\text{-}org} + R_{cell\text{-}spl})}{(R_{cell\text{-}org} + R_{cell\text{-}spl}) + (n_{cell} - 1) \times (R_{cell\text{-}s} + R_{cell\text{-}spl})}$$

In the event of a defect, the impedance generated by the short-circuit prevention part can prevent the occurrence of short circuit (because a resistance is connected in series to the device in which the short circuit occurs). At the same time, two important factors must be considered for such short-circuit prevention system: (1) the panel should have enough pixels (i.e. Nell); and (2) the resistance for prevention of the short circuit should be as large as possible (i.e. $R_{cell\text{-}sp1}$). If the above two necessary conditions cannot be met, the short-circuit prevention effect will not be obvious, and the short circuit point will generate high heat due to high current ($P=I^2R$; P=power, I=current, R=resistance), thereby reducing its reliability. Experiments show that the above-mentioned short circuit prevention system is suitable for the power supply of constant voltage, that is, the current can vary in a very broad range. However, most of the power supply devices cannot meet this requirement. Furthermore, most of the OLED devices have a power supply of constant current, and the above short circuit protection mechanism will result in a large amount of failure current (i.e. the current passing through the short circuit points (current of normal OLED device under effective supply+failure current at short circuit points=total output current of a constant current power supply)) at the short circuit points, thereby reducing the photoelectric performance of the panel. If the resistance of the circuit protection structure is large enough to match with the equivalent resistance of a pixel, the circuit protection design can be achieved in the form of series resistance. However, as calculated the equivalent resistance of a pixel is usually tens to hundreds of thousands of ohm, which is usually far higher than the resistance of the circuit protection structure, so there will be a high percentage of current passing through the short circuit points, causing significant change in light efficiency of the entire panel.

SUMMARY OF THE INVENTION

The present invention aims to solve the problem that when short circuit occurs in the panel in the prior art, a high proportion of current passes through the short circuit point, causing influence on the light efficiency of the entire panel.

In order to solve the above problem, the present invention provides a highly stable organic light-emitting panel, comprising a substrate and a plurality of pixelated OLED circuit assemblies, wherein the substrate is further provided with an auxiliary electrode, an insulator and a plurality of circuit protection structures, wherein each of the plurality of circuit protection structures is electrically connected to a corresponding pixelated first electrode in each of the plurality of OLED circuit assemblies, and the plurality of circuit protection structures are respectively electrically connected to the auxiliary electrode, wherein the insulator covers the auxiliary electrode, the plurality of circuit protection structures and an area between the plurality of circuit protection structures and the plurality of OLED circuit assemblies; and wherein when a current passing through a pixel with short-circuit defect in any one of the plurality of OLED circuit assemblies is greater than a predetermined fusing threshold value of the circuit protection structure, the circuit protection structure corresponding to the pixel with short-circuit defect is adapted to fuse, thereby isolating the OLED circuit assembly corresponding to the pixel with short-circuit defect from the OLED circuit assembly corresponding to a normal working pixel.

Preferably, a normal working pixel in each of the plurality of OLED circuit assemblies has an average current of J, and the predetermined fusing threshold value of each of the circuit protection structures is at least 100 times the average current J of the normal working pixel.

Preferably, the predetermined fusing threshold value of each of the circuit protection structures is at a level of $10^2$ J to $10^3$ J.

Preferably, the panel is provided with at least 100 pixelated OLED circuit assemblies.

Preferably, the circuit protection structure is a fuse, and two ends of the fuse are respectively connected with the auxiliary electrode and the pixelated first electrode in the OLED circuit assembly, and when a pixel with short-circuit defect occurs, the fuse corresponding to the pixel with short-circuit defect reaches a fusing threshold value.

Preferably, a short circuit current passing through the fuse has a density of at least greater than $10^{11}$ mA/cross-sectional area (m$^2$); wherein the cross-sectional area is the product of a width and a thickness of the fuse, and the width and thickness are the distance perpendicular to the current direction.

Preferably, when the fuse reaches a circuit fusing condition, an average power consumption per unit length L(μm)

of the fuse is greater than $10^{-3}$ joules, and wherein the average power consumption per unit length is calculated according to the following formula:

$$Q=(I_s^2*R/L)*T$$

wherein, $I_s$ represents the current of pixel with short circuit,

R represents a resistance value of the fuse,

L represents a length of the fuse in the current direction, measured in μm, and

T represents the action time before the circuit fuses, measured in seconds.

Preferably, an influence area of thermal energy generated when the fuse reaches the circuit fusing condition is a circular area with a diameter of less than 200 μm based on the center of the fusing.

Preferably, each of the circuit protection structures is connected in series with a second resistance protector, the circuit protection structure is adapted to provide protection to the panel when a pixel with short-circuit defect occurs due to low resistance fault in a pixelated load circuit connected in series with the circuit protection structure, and the second resistance protector is adapted to provide protection to the panel when a pixel with short-circuit defect occurs due to medium/high resistance fault in the pixelated OLED circuit assembly.

Preferably, the load comprises at least one second resistance protector and/or at least one pixelated OLED circuit assembly.

Preferably, the circuit protection structure is a low resistance fault protector electrically connected with the auxiliary electrode, and when a current passing through a pixel with short-circuit defect caused by low resistance fault is greater than the predetermined fusing threshold value of the circuit protection structure, the circuit protection structure corresponding to the pixel with short-circuit defect is capable to fuse, thereby isolating the OLED circuit assembly corresponding to the pixel with short-circuit defect from OLED circuit assembly corresponding to normal working pixel.

Preferably, the circuit protection structure is a metal conductor, a metal oxide conductor, or a metal/metal oxide composite material, and has a conductor width of 0.1 μm to 10 μm and a conductor thickness of 10 nm to 1000 nm.

Preferably, the circuit protection structure is a metal conductive material with a melting point of less than 800° C., a conductor width of 1 μm to 10 μm and a conductor thickness of 10 nm to 300 nm.

Preferably, an insulating material layer with a melting point of less than 400° C. is arranged on the substrate below the circuit protection structure.

Preferably, the predetermined fusing threshold value of each of the plurality of circuit protection structures is 5 mA or is a value which allows to generate a short-circuit current gain of greater than 300.

Preferably, the predetermined fusing threshold value of each of the plurality of circuit protection structures is a value which allows to generate a short-circuit current gain of greater than 1000.

Preferably, the second resistance protector is a high resistance fault protector and is electrically connected with the pixelated first electrode of the OLED circuit assembly, and is capable of providing protection when a fault impedance is between a maximum impedance of the pixel with short-circuit defect caused by the low resistance fault and an equivalent impedance of a normal working pixelated OLED circuit assembly.

Preferably, the high resistance fault protector is a metal or metal oxide having a sheet resistance of 10-100Ω/□ and having an aspect ratio to allow the circuit protection structure to have a resistance of 400-20000Ω, and the high resistance fault protector has a voltage consumption which is less than 10% of the operation voltage of a panel.

Preferably, when short-circuit defect occurs in a pixel due to a high resistance fault in any one of the pixelated OLED circuit assemblies but the generated short-circuit current gain is smaller than 300 or the short-circuit current is smaller than 5 mA, the circuit protection structure corresponding to the pixel with short-circuit defect shall not fuse and the panel shall maintain normal photoelectric characteristic output.

Preferably, each of the circuit protection structures is integrally molded with the second resistance protector.

Preferably, the circuit protection structure and the second resistance protector are made of same or different conductive materials, and wherein the circuit protection structure has a cross-sectional area perpendicular to the current direction, the second resistance protector has a cross-sectional area perpendicular to the current direction, and the cross-sectional area of the circuit protection structure is less than the cross-sectional area of the second resistance protector.

The present invention has the one or more following advantages over prior art:

A. In the present invention, the substrate is provided with an auxiliary electrode, each of the plurality of pixelated OLED circuit assemblies is connected to a circuit protection structure, and all of the circuit protection structures are electrically connected to the auxiliary electrode on the substrate. Each circuit protection structure is independently provided with a fusing condition, and quick fusing can be realized by selecting suitable short circuit current affected by a pixel with short-circuit defect. When one or more of the OLED circuit assemblies on the substrate encounter short circuit defect, its corresponding circuit protection structure will fuse in time, thereby isolating the OLED circuit assembly having the short circuit defect from normal working OLED circuit assemblies, and preventing the heat generated by fusing of the circuit protection structure from affecting the normal panel pixels, so as to provide real time protection to the panel and improve the reliability of the panel.

B. In the present invention, a joule heat fusible fuse is adopted, and an influence area of the thermal energy of the pixel with short-circuit defect is defined. By amplifying the ratio of the short-circuit point current to the normal pixel current, the short-circuit prevention design can realize real-time fuse and minimize the burn area of the surrounding pixel. At the same time, the panel is provided with at least 100 pixelated OLED circuit assemblies, so as to ensure that current of the short-circuit point is at least 100 times different from the normal pixel current, and that the circuit protection structure will protect the whole OLED circuit assemblies when sudden fluctuations occur.

C. In the present invention, each circuit protection structure is respectively connected in series with a second resistance protector between the pixelated first electrode in each of the pixelated OLED circuit assemblies and the auxiliary electrode. The circuit protection structure is adapted to provide protection to the panel when short-circuit defect occurs in a pixel due to low resistance fault in the pixelated OLED circuit assemblies, and the second resistance protector is adapted to provide protection to the panel when short-circuit defect occurs in a pixel due to medium/high resistance fault in the pixelated OLED circuit assemblies, such that the present invention can provide short circuit prevention protect when different types of short circuit defects occur in the OLED circuit assemblies, thereby improving the reliability of the panel.

D. In a preferred embodiment of the present invention, the auxiliary electrode, low resistance fault protector, high resistance fault protector and the first electrode are sequentially connected in series. The combination of the low resistance fault protector and high resistance fault protector can effectively protect the panel under different conditions, thereby ensuring the reliability of the panel. At the same time, the influence of different types of defects on the panel is fully considered, and different parameters for different short circuit prevention design in units are proposed. An insulating material is covered on the auxiliary electrode—low resistance fault protector—high resistance fault protector, thereby preventing forming short circuit with the second electrode which will cause panel failure. The low resistance fault protector can simultaneously provide protection when the defect point occurs in the high resistance fault protector area or the luminous area, thereby helping to increase the yield. At the same time, the high resistance fault protector can provide effective protection when a short circuit occurs in a pixel region due to high resistance fault, and shall not fuse when the generated short circuit current gain is less than 300 or the current is less than 5 mA. Therefore, the high resistance fault protector in pixel with big resistance defect is designed to be in parallel connection with other normal pixel, and the panel can work normally as long as the total current of the normal pixels account for 97% or more of the total current.

E. Since the second resistance protector accounts for 5% to 30% of the pixel area of the pixelated OLED circuit assemblies, depending on the resistance of the designed second resistance protector and the process capability, there is a probability that the second resistance protector may also encounter short-circuit defects. When short circuit defects occur in the region of the second resistance protector and results in failure of the second resistance protector, the circuit protection structure can provide effective protection to more than 99% pixel area of the pixelated OLED circuit assemblies (including light emitting area and the second resistance protector). Therefore, the series connected circuit protection structure and the second resistance protector can not only provide protection when short-circuit point of high and low resistance defects occur, but also provide protection when the second resistance protector and pixelated OLED circuit assemblies encounter short circuit defects, thereby effectively solving the problem that prior art technology cannot provide protection "when the resistance protector encounters defects."

BRIEF DESCRIPTION OF THE DRAWINGS

In order to make the contents of the invention easier to be clearly understood, the invention is further described in detail according to the specific embodiments of the invention and the attached drawings, wherein.

REFERENCE NUMBERS

1—first electrode; 2—auxiliary electrode; 3—circuit protection structure; 3'—circuit protection structure in fusing state; 4—short circuit defect; 5—substrate; 6—insulator; 7—OLED circuit assembly; 8—second electrode; 9—second resistance protector.

DETAILED DESCRIPTION OF EMBODIMENTS

The purpose, technical solution and advantages of the present invention will now be described in detail with reference to the embodiments and accompanying drawings.

Figure 2:
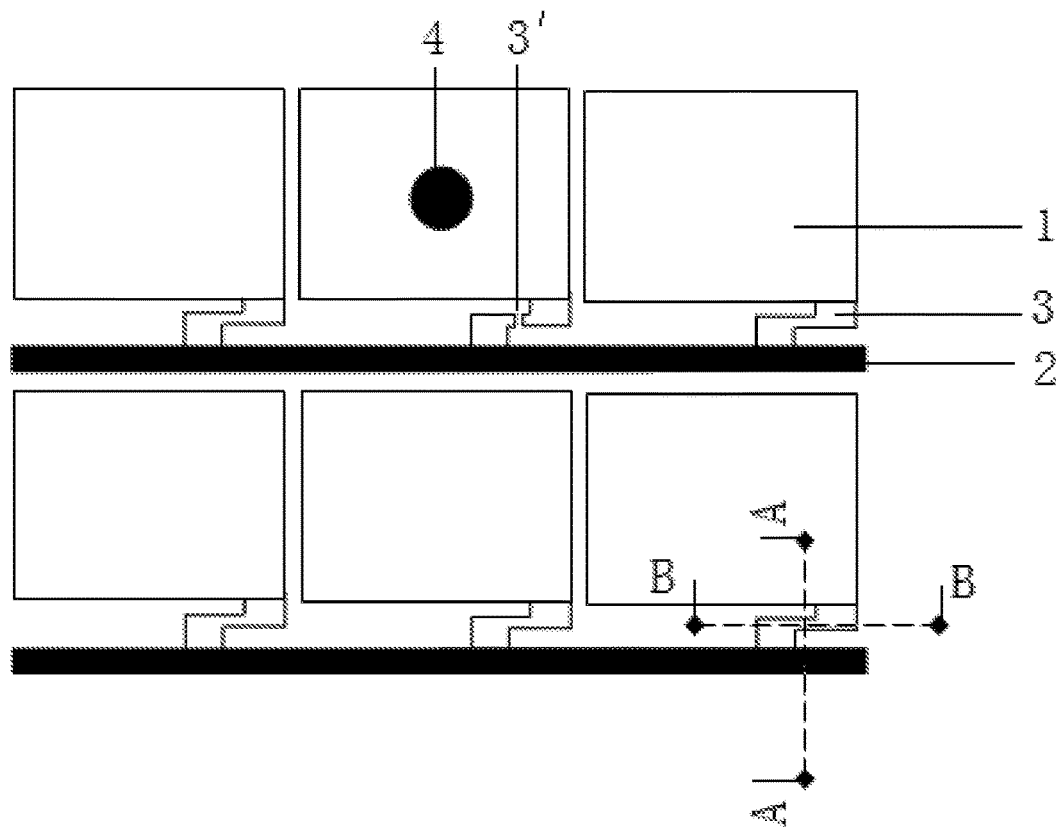
FIG. 2 is a local structural schematic diagram showing the spatial connection of the first kind of circuit protection structure on the substrate in one embodiment of the present invention.
Figure 3:
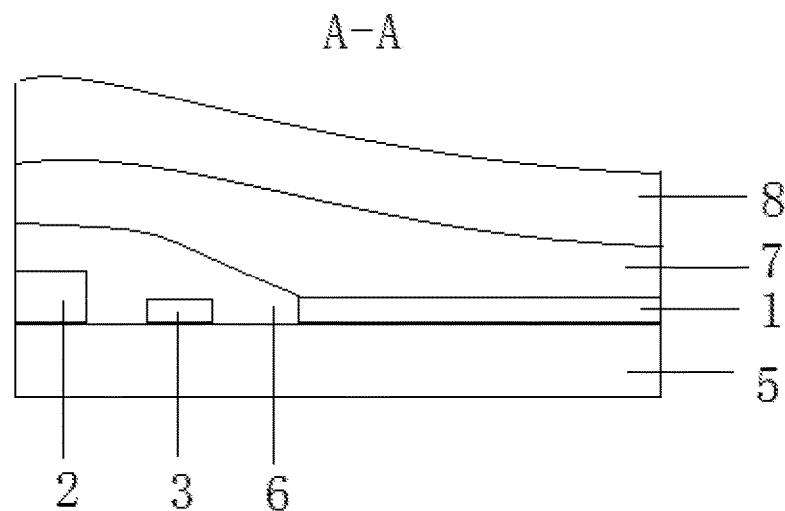
FIG. 3 is a schematic diagram showing A-A section in FIG. 2.
Figure 4:
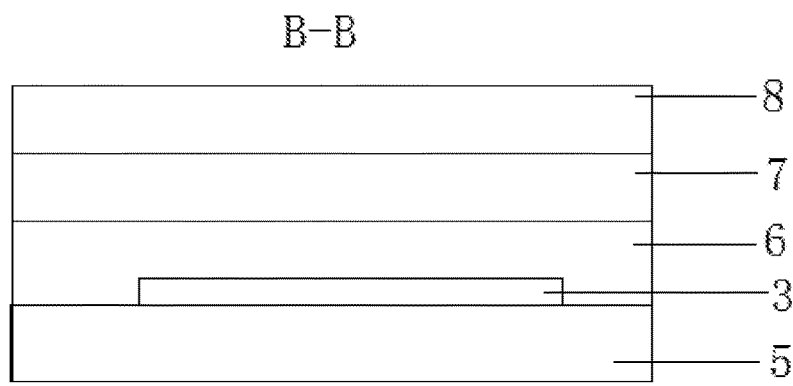
FIG. 4 is a schematic diagram showing B-B section in FIG. 2.

By referring to FIG. 2, FIG. 3 and FIG. 4, the present invention provides a highly stable OLED product, comprising a substrate 5, an insulator 6, a plurality of pixelated OLED circuit assemblies 7 arranged on the substrate 5, and a second electrode 8. Each of the OLED circuit assemblies 7 at least comprises a hole transport layer (HTL), a light-emitting layer (EL) and an electron transport layer (ETL) which are sequentially stacked. The second electrode 8 is arranged on the electron transport layer (ETL), and the hole transport layer (HTL) is arranged on the first electrode 1. An auxiliary electrode 2 and a plurality of circuit protection structures 3 are provided on the substrate 5. One end of each of the circuit protection structures 3 is electrically connected to a corresponding pixelated first electrode in each of the plurality of OLED circuit assemblies 7, and the other end of each of circuit protection structures is respectively electrically connected to the auxiliary electrode 2. The insulator 6 covers the auxiliary electrode, the plurality of circuit protection structures and an area between the plurality of circuit protection structures and the edge of the first electrode. Herein, the auxiliary electrode 2 functions as a bus, and each of the circuit protection structures 3 is connected to the auxiliary electrode 2. The insulator 6 covers the auxiliary electrode 2, the circuit protection structures 3 and the area between the circuit protection structures 3 and the OLED circuit assemblies 7. When a current passing through a pixel with short-circuit defect in any one of the OLED circuit assemblies is greater than a predetermined fusing threshold value of the circuit protection structure 3, the circuit protection structure 3 corresponding to the pixel with short-circuit defect is capable to fuse, thereby isolating the OLED circuit assembly 7 corresponding to the pixel with short-circuit defect from other OLED circuit assemblies 7 corresponding to normal working pixels. Therefore, the normal working OLED circuit assemblies 7 obtain protection and the reliability of the panel is improved.

Figure 1:
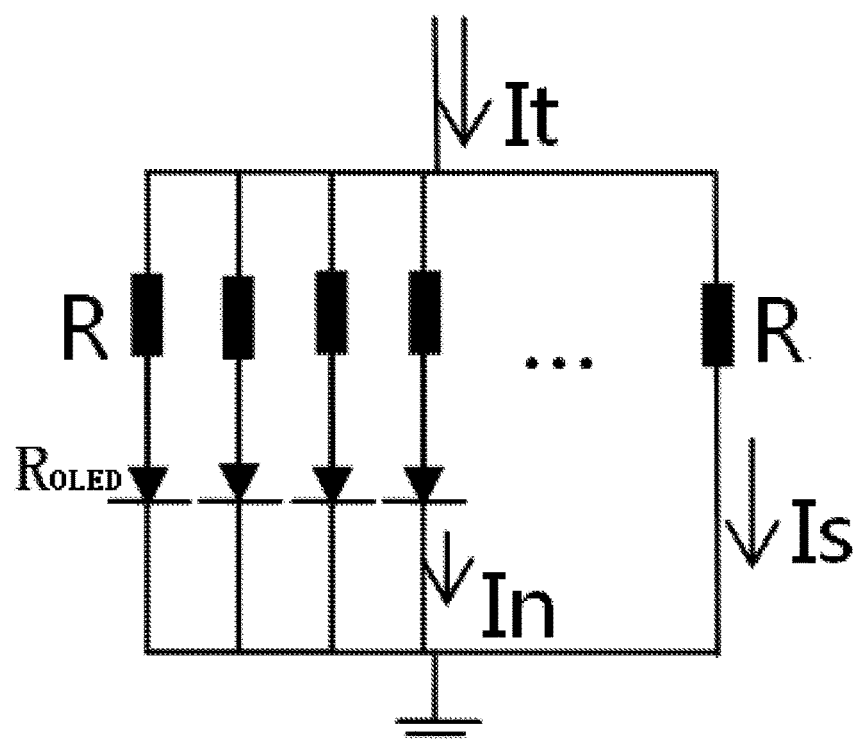
FIG. 1 is a schematic diagram showing a circuit connection of OLED panel with a first kind of circuit protection structure in one embodiment of the present invention.

FIG. 1 is a schematic diagram showing a first circuit connection of a plurality of pixelated OLED circuit assemblies in one embodiment of the present invention. A normal working pixel in each of the OLED circuit assemblies 7 has an average current of J, i.e. $J = I_t/n$. When a current passing through a pixel with short-circuit defect in any one of the OLED circuit assemblies is greater than the predetermined fusing threshold value, the circuit protection structure corresponding to the pixel with short-circuit defect is capable to fuse. Herein the fusing resistance value of the circuit protection structure can be determined according to experiments. For example, the predetermined fusing threshold value is at least 100 times the average current J of the normal working pixels, i.e. the predetermined fusing threshold value of the circuit protection structures is at least 100 J. In the present invention, the predetermined fusing threshold value is set at a level of $10^2$ J to $10^3$ J. When a short circuit defect 4 occurs as shown in FIG. 2 and when the current passing through the circuit protection structure corresponding to this pixel with short-circuit defect exceeds 100 J, the circuit protection structure automatically fuse to disconnect the OLED circuit assembly which is connected thereto, thereby timely isolating the OLED circuit assembly which encounters short circuit defect and protecting other normal OLED circuit assemblies from being affected. Preferably, the predetermined fusing threshold value of the circuit protection structures is 500 J. Of course, the substrate of the panel is provided with at least 100 pixels to ensure the current of the short-circuit point is at least 100 times different from the normal pixel current and the circuit protection structure will protect the whole OLED circuit assemblies when sudden fluctuations occur.

By referring to FIG. 1, Is, i.e. the current passing though the short circuit point, is calculated according to the following formula:

$$I_s = I_t \times (R + R_{OLED}) / [(R + R_{OLED}) + (n-1)(R)]$$

The above formula shows the relationship of the current passing though the short circuit point and the total current $I_t$ of the panel.

wherein: $I_t$ represents the total current;

R represents a resistance value of the circuit protection structure;

$R_{OLED}$ represents an equivalent resistance value of OLED pixels; and n represents the total number of pixels.

In the present invention, the ratio of the current passing though the short circuit point to the average current of the normal pixels is related to the resistance coefficient of the circuit protection structure, as described in the above formula.

As shown in FIG. 2, it is preferred that each of the OLED circuit assemblies is connected in series with a circuit protection structure. Herein the circuit protection structure is a fuse, two ends of which are respectively connected to the auxiliary electrode and the pixelated first electrode of the OLED circuit assembly. When a pixel with short-circuit defect appears, the corresponding fuse reaches its fusing threshold value. If one OLED circuit assembly is connected in series with multiple (a number of M) parallel fuses, the total ratio Is/J will be increased, but the actual ratio of the current of the fuses at the short circuit point to the average current of the normal pixels will become (Is/J)/M, which will obviously increase the difficulty of fusing.

When a short circuit defect occurs, the current density through the fuse is calculated to be at least $10^{11}$ mA/cross-sectional area ($m^2$). The cross-sectional area is the product of a width and a thickness of the fuse, and the width and thickness are the distance perpendicular to the current direction.

The actual ratio of the current of the pixel with short-circuit defect to the average current of normal pixels depends on the geometry shape and material of the circuit protection structure.

If the length of the fuse in the same direction as the current is L, when a short circuit point occurs, the average power consumption per unit length is: $Q = (I_s^2 \ast R / L) \ast T$. In other words, the power consumption per unit length can be calculated by multiplying the square of the short-circuit pixel current $I_s$ by the resistance value of the fuse, then divided by the length L(μm) of the fuse in the same direction of the current, and finally multiplied by the action time T before the circuit is fused. It is calculated that the fusing condition of the fuse can be reached when the average power consumption per unit length (μm) exceeds $10^{-3}$ joules.

At fusing conditions, the fusing rate can be increased by doubling the current of the pixel with short-circuit defect. The fusing rate can be evaluated by the value of the average power consumption per unit length (μm). Experiments prove that the fusing process will cost approximately 200 milliseconds when the power consumption per unit length is $10^{-3}$ joules, and approximately 100 milliseconds when the power consumption per unit length is doubled. If calculated based on the current density through the fuse when the short circuit defect occurs, the fusing rate is inversely proportional to the square of the current of the short-circuit pixel.

In addition, the fusing of the fuse can be realized due to a high temperature caused by a high current through the short circuit point of the pixel. Such conditions ensure that the area affected by high temperature heating is less than a circular range with a diameter of 200 μm.

In the present invention, each fuse independently arranged on the substrate is provided with a fusing condition, and quick fusing can be realized by selecting suitable short circuit threshold current, thereby providing real-time protection to the panel when a defect occurs and thus greatly improving the reliability of the panel.

Example 1

OLED panels are provided, each having a pixel number of 10000, an operation voltage of 6V and a corresponding current of 100 mA. Fuses having resistance of 30 Ω, 60Ω, 200Ω, 600Ω are respectively connected in series with each of the pixelated OLED circuit assemblies, and each pixel has an average current J of 0.01 mA. When a complete short circuit defect point appears, the current $I_s$ of the pixel with short-circuit defect is 66.6 mA, 50.0 mA, 23.1 mA and 9.1 mA according to different resistance design, and the corresponding coefficient $I_s/J$ is 6667, 5000, 2308 and 909 respectively. The smaller the value of $I_s/J$ is, the more difficult to reach the fusing condition of the fuse. Experiments indicate that the fuse will not reach fusing condition until the entire panel is burn when the fuse has a resistance of 600Ω. At the same time, the influenced area of surrounding pixels due to the joule heat of the fuse has a diameter of about 50 μm, 100 μm, >500 μm and panel failure respectively according to different resistance design. Therefore, increasing the coefficient $I_s/J$ can accelerate fusing and minimize the burn area.

Example 2

An OLED panel is provided, having a pixel number of 100, an operation voltage of 6V and a corresponding current of 100 mA. Fuses of 30 Ω, 60Ω, 200Ω, 600Ω are respectively connected in series with each of the pixelated OLED circuit assemblies, and each pixel has an average current J of 1 mA. When a short circuit defect point appears, the current $I_s$ of the pixel with short-circuit defect is 67.0 mA, 50.4 mA, 23.3 mA and 9.22 mA according to different resistance design, and the corresponding coefficient $I_s/J$ is 67.0, 50.4, 23.3 and 9.22 respectively. The smaller the value of $I_s/J$ is, the more difficult to reach the fusing condition of the fuse. Experiments indicate that the fuse will not reach fusing condition until the entire panel is burn when the fuse has a resistance of 600Ω At the same time, the influenced area of surrounding pixels due to the joule heat of the fuse has a diameter of about 50 μm, 100 μm, >500 μm and panel failure respectively. Therefore, increasing the coefficient $I_s/J$ can accelerate fusing and minimize the burn area.

Figure 5:
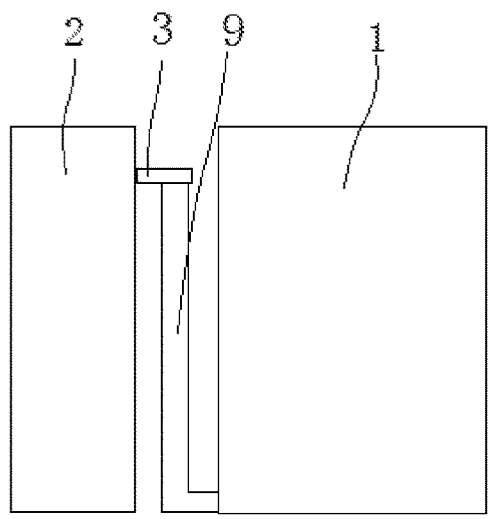
FIG. 5 is a local structural schematic diagram showing the spatial connection of the low resistance fault protector and high resistance fault protector in one embodiment of the present invention.

By referring to FIG. 5, each of the circuit protection structures 3 is connected in series with a second resistance protector 9. The circuit protection structure 3 is adapted to provide protection to the panel when a pixel with short-circuit defect occurs due to low resistance fault in a pixelated load circuit connected in series with the circuit protection structure, wherein the load comprises at least one second resistance protector and/or at least one pixelated OLED circuit assembly. The second resistance protector 9 is adapted to provide protection to the panel when a pixel with short-circuit defect occurs due to medium/high resistance fault in the pixelated OLED circuit assembly 7. The auxiliary electrode 2 herein can electrically connect all of the pixels containing the circuit protection structure 3 and the second resistance protector 9, in the form of but not limited to metal grid structure, which is only one way to achieve the electrical connection of all of the pixels.

The circuit protection structure 3 is a low resistance fault protector electrically connected with the auxiliary electrode 2, and when a current passing through a pixel with short-circuit defect caused by low resistance fault is greater than the predetermined fusing threshold value of the circuit protection structure 3, the circuit protection structure 3 corresponding to the pixel with short-circuit defect is capable to fuse, as shown in FIG. 2 where the circuit protection structure 3' is in fusing state, thereby isolating the OLED circuit assembly corresponding to the pixel with short-circuit defect from OLED circuit assembly corresponding to normal working pixels, so as to realize the protection of other normal OLED circuit assemblies 7 and improve the reliability of the panel.

In the present invention a pixelated device structure is adopted, and a conductive material with low resistance is used as the auxiliary electrode 2. An organic light emitting diode device comprises a first electrode, a light-emitting element, and a corresponding second electrode, wherein the light emitting element is comprised in an orthogonal projection portion of the first electrode and second electrode, and the projection area is defined as the luminous area. At least one of the first electrode and the second electrode is translucent or transparent electrode, and the translucent electrode and the transparent electrode have an optical transmittance of more than 30% and more than 80% in visible light range, respectively.

The low resistance fault protector is mainly designed for dealing with low resistance defect in the luminescent pixel. When a low resistance defect occurs, the low resistance fault protector can provide protection in the following three manners.

A first manner is to increase the current density passing through it. The current passing through this structure can be controlled by adjusting a conductor width to 0.1 μm to 10 μm or adjusting a conductor thickness to 10 nm to 1000 nm. It can adopt the same material as other short circuit prevention structure having multiple units connected in series, usually adopting a metal oxide conductor such as indium tin oxide and zinc oxide, etc., or a metal conductor or a metal/metal oxide composite conductor.

A second manner is to use a conductive materials with a melting point of less than 800° C., such as silver, tin and other nano-metal materials, with a wire width of 1 μm to 10 μm and a wire thickness of 10 nm to 300 nm, to achieve the purpose of the present invention, i.e. to provide protection to the panel from being damaged due to a short-circuit defect.

A third manner is to arrange the above mentioned low resistance fault protector on an insulating material having a melting point of lower than 400° C., for example on a high polymer material or an organic material, such as a resin material or a photoresist material. When a defect occurs, the insulating material layer will be burn out due to the generated local high temperature, thereby breaking the circuit. The insulating layer can be also used for low resistance defects of metal oxide or metal wire. Depending on the design of the circuit protection structure, the present invention can provide protection to the panel against low resistance defects occurring in the pixelated OLED circuit assemblies.

The fusing threshold value in each low resistance fault protector is set at a value which allows to generate a short-circuit current gain of greater than 300, preferably 1000, or preferably the fusing threshold value is 5 mA. The term 'short-circuit current gain' means a ratio of the short-circuit current to the average current of the normal pixels.

Figure 6:
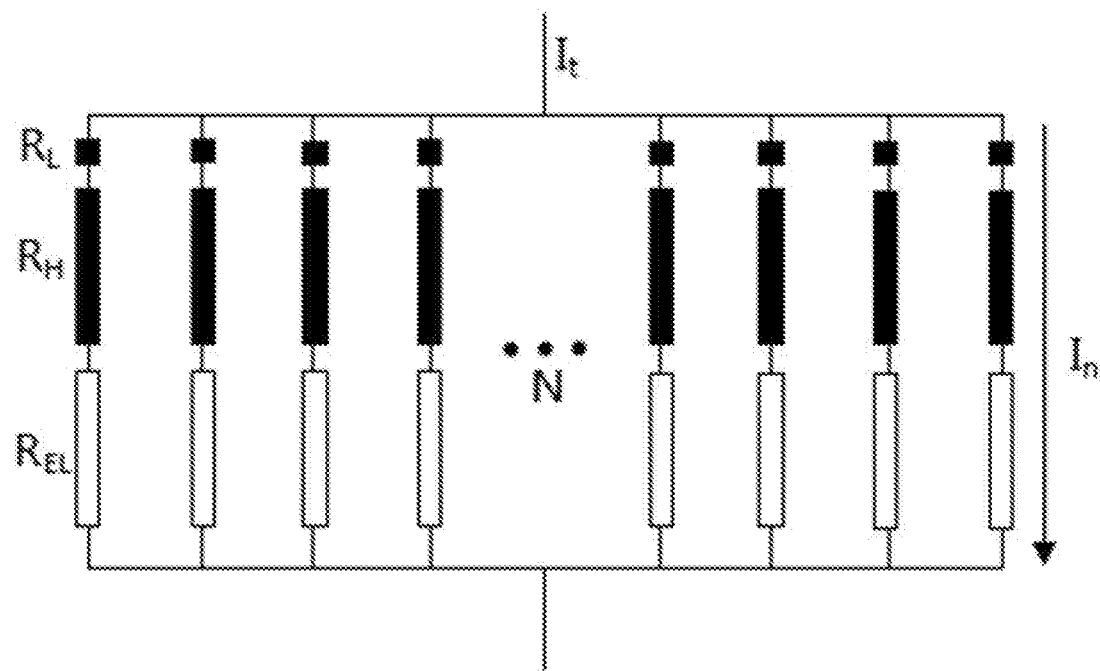
FIG. 6 is a schematic diagram showing the circuit connection of OLED panel with both low resistance fault protector and high resistance fault protector in one embodiment of the present invention.

As shown in FIG. 6, the low resistance fault protector here adopts a fuse, and two ends of the fuse are respectively connected with the auxiliary electrode and the high resistance fault protector. When a pixel with short-circuit defect due to low resistance defect occurs, the fuse corresponding to the pixel with short-circuit defect reaches its fusing threshold value, and the current passing through the fuse is calculated to be at least greater than $10^{11}$ mA/cross-sectional area ($m^2$); wherein the cross-sectional area is the product of a width and a thickness of the fuse, and the width and thickness are the distance perpendicular to the current direction.

When the defect's resistance is greater than 500Ω, a design for high resistance defect is adopted to ensure the overall short circuit has a resistance of more than 900 (400+500) Ω.

By referring to FIG. 5, the second resistance protector 9 is a high resistance fault protector and is electrically connected with the pixelated first electrode 1 of the OLED circuit assembly 7, and is capable of providing protection when a fault impedance is between a maximum impedance of the pixel with short-circuit defect caused by the low resistance fault and an equivalent impedance of a normal working pixelated OLED circuit assembly. The high resistance fault protector is a metal or metal oxide having a sheet resistance of 10-100Ω/□ and having an aspect ratio to allow the protector to have a resistance of 400-20000Ω, and the high resistance fault protector has a voltage consumption which is less than 10% of the operation voltage of a panel. The second resistance protector 9 and the circuit protection structure 3 can be made of same or different conductive materials, and can be made in the same layer. When they are made of the same material, the current density of the circuit protection structure 3 is at least 5 times the current of the second resistance protector 9, which can be realized by controlling the width and thickness of the protective resistor. Of course, the circuit protection structure 3 can be integrally molded with the second resistance protector 9, but with differences in shape and cross-sectional area of the circuit protection structure 3 and the second resistance protector 9, such that the whole manufacture process is easier.

The influence of the high resistance fault protector on the panel voltage is illustrated by the following example.

An OLED panel having 1000 pixels is provided. When driven with an operation current of 10 mA, 20 mA and 30 mA respectively, the corresponding drive operation voltage is 6.0 V, 6.3 V and 6.6 V, and the brightness of the panel is 2000 nit, 4000 nit and 6000 nit respectively. High resistance fault protectors of 20000 Ω, 10000 Ω, 5000 Ω, 1000Ω and 400Ω are used respectively. The voltage of the second resistance protector is shown in the following table:

|          | 20KΩ   | 10KΩ   | 5KΩ     | 1KΩ     | 400Ω    |
|----------|--------|--------|---------|---------|---------|
| 2000 nit | 0.2 V  | 0.1 V  | 0.05 V  | 0.01 V  | 0.004 V |
| 4000 nit | 0.4 V  | 0.2 V  | 0.1 V   | 0.02 V  | 0.008 V |
| 6000 nit | 0.6 V  | 0.3 V  | 0.15 V  | 0.03 V  | 0.012 V |

It shows that the voltage consumed by the second resistance protector in the normal use range of the panel is less than 10% of the operation voltage of the panel. In order to avoid excessive influence on the panel performance and heating characteristics, for the same luminous area, the consumption voltage of the second resistance protector can be adjusted by using different number of pixels.

For example, when OLED panels of the same size are used, set with 1000-4000 pixels, driven with an operation current of 30 mA, with a panel brightness of 6000 nit, and with a high resistance fault protector having a resistance of 20000Ω, the corresponding voltage of the second resistance protector is shown in the following table:

| Operation voltage of panel/V | Voltage of OLED device/V | Number of pixels | Voltage of the second resistance protector/V | Aperture ratio of light emitting area |
|------|------|------|------|-----|
| 6.6  | 6    | 1000 | 0.6  | 85% |
| 6.65 | 6.25 | 1500 | 0.4  | 83% |
| 6.7  | 6.4  | 2000 | 0.3  | 80% |
| 6.75 | 6.51 | 2500 | 0.24 | 77% |
| 6.8  | 6.6  | 3000 | 0.2  | 72% |
| 6.9  | 6.73 | 3500 | 0.17 | 65% |
| 7    | 6.85 | 4000 | 0.15 | 53% |

The table shows that, for panels of the same size, although the number of pixels are different, the voltage consumption of the second resistance protector is always less than 10% of the operating voltage, and the larger the number of pixels, the smaller the voltage of the second resistance protector, thereby effectively decreasing the voltage consumption of the second resistance protector. However, the voltage of the OLED device increases with the increase of the number of pixels. This is because the pixel segmentation leads to decrease of the aperture ratio of the light emitting area, and thus results in increase of the voltage-current characteristic corresponding to the current density of each pixel, so it has nothing to do with the second resistance protector.

Figure 7:
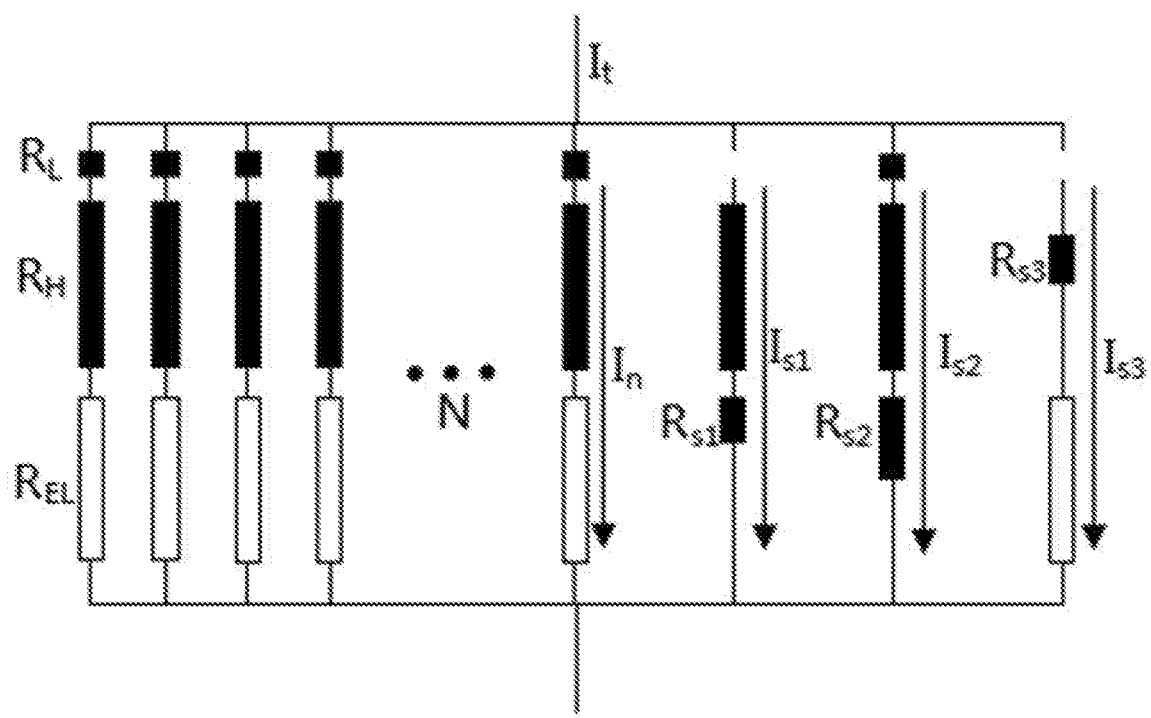
FIG. 7 is a schematic diagram showing the simulation circuit at different failure modes of the OLED panel with both low resistance fault protector and high resistance fault protector in one embodiment of the present invention.

By referring to FIG. 7, each pixel (having an equivalent resistance as $R_{EL}$) of the OLED circuit component is in electrical series connection with an auxiliary electrode, and the series connection comprises a low resistance fault protector (having an equivalent resistance as $R_L$) and a high resistance fault protector (having an equivalent resistance as $R_H$). Each piece of panel contains a number of N (N>500) of pixels. The panel has a total current as $I_t$, and each pixel has an average current as $I_n$, wherein $I_n=I_t/N$.

During the specific operation of the panel, there may be three types of short circuit defects as shown in FIG. 7.

(1) A pixel has a short circuit with a small resistance. The resistance of this defect is defined as $R_{s1}$, and the current passing through the pixel is defined as $I_{s1}$;

(2) A pixel has a short circuit with a large resistance. The resistance of this defect is defined as $R_{s2}$, and the current passing through the pixel is defined as $I_{s2}$;

(3) A defect appears in the second resistance protector area, which causes failure of the high resistance fault protector $R_H$. The resistance of this defect is defined as $R_{s3}$ and the current passing through the pixel is defined as $I_{s3}$.

Among the above types of defects, types (1) and (3) have higher short circuit current, and the calculated current gain is more than two orders of magnitude, preferably is three orders of magnitude, wherein the current gain is defined as a ratio of the short circuit current to the current of normal pixel, i.e. $I_s/I_n>300$ (preferably larger than 1000), or the short circuit current is greater than 5 mA. The low resistance fault protector $R_L$ breaks to provide protection, and the breaking mechanism is based on the electrical power formula of $P=I^2R$. Increasing the current density or decreasing the melting point of this region will increase the instantaneous power ($W=I^2RT$) and result in a high temperature in a minimum area, wherein the action time T is within 200 ms. As a result, the failure pixel is isolated, and finally the short-circuit current of these two types of defects is zero. The above type (2) defect is a high resistance defect failure of pixels, and the generated short circuit current gain $I_{s2}/I_n<300$ or the current is less than 5 mA, which cannot cause circuit breaking. Therefore, the high resistance fault protector with the high resistance defect is in parallel connection with the other normal pixels respectively, and the normal pixels accounts for more than 97% of the total current, preferred more than 99%, thereby ensuring normal working of the panel.

The current of the pixel with short circuit defect is calculated as follows:

$$I_s = I_t \times \frac{((R_{EL} + R_L + R_H))}{(R_{EL} + R_L + R_H) + (N-1)(R_s + R_H + R_L)}$$

The high resistance fault protector is a metal or metal oxide having a sheet resistance of 10-100Ω/□ and having an aspect ratio to allow the circuit protection structure to have a resistance of 400-20000Ω.

A panel comprising multiple short circuit prevention units is in series connection with at least one short circuit protection structure against low resistance defects and at least one short circuit protection structure against high resistance defects, not only a connection construction with specific aspect ratio. Optimization can be made according to the total number of pixels, operating current, protection effect, in order to obtain a multiple-unit short circuit protection construction suitable for OLED panel of different sizes.

Example 3

Short Circuit Protection for Small Sized Panel (Small Current of 10 to 30 mA)

OLED panels herein used have a voltage of 6V and a current density for each pixel of 0.0126 mA. The number of pixels is 800, 1600, 2400, respectively, and the corresponding area is 144 mm² to 433 mm². The low resistance fault protector is a metal conductive material with a melting point of 800° C., and has a conductor width of 0.1 un or a conductor thickness of 10 nm. An insulation layer having a melting point of 400° C. is arranged on the substrate below the low resistance fault protector. The resistance of the low resistance fault protector in multiple units can be ignored. The high resistance fault protector has a sheet resistance of 50Ω/□, with different aspect ratios, and the corresponding equivalent resistance is 500Ω, 1000Ω, 5000Ω, 10000Ω. The short-circuit points are supposed to have an equivalent impedance of A-0Ω, B-100Ω, C-500Ω, D-1000Ω and E-5000Ω, respectively. The experimental results are shown in the following table 1. The results indicate that increase of resistance causes significant decrease of the proportion of short circuit current. When the short circuit current gain is greater than 300, it is within the protection range of the low resistance fault protector, and the defect point can be isolated by breaking the circuit when a short circuit defect appears, thereby ensuring the normal operation of the panel. When the equivalent resistance of the short circuit defect point increases, the current gain coefficient will decrease, resulting in failure of the low resistance fault protector. Therefore, in this case, a high resistance fault protector in series connection is adopted, which can guarantee the proportion of failure current is less than 2% when a short circuit defect occurs. In other words, 98% of the photoelectric properties can be maintained when there is one short circuit defect. At this time the low resistance fault protector cannot provide effective protection against the defects occurring in the light emitting area, but can effectively prevent occurrence of short circuit defects in the high resistance fault protector area.

Example 4

Short Circuit Protection for Medium Sized Panel (Current of 31 to 200 mA)

OLED panels herein used have a voltage of 6V and a current density for each pixel of 0.0126 mA. The number of pixels is 2500, 8000, 16000, respectively, and the corresponding area is 451 mm² to 2888 mm². The low resistance fault protector is a metal conductive material with a melting point of 700° C., and has a conductor width of 10 μm or a conductor thickness of 1000 nm. An insulation material layer having a melting point of 300° C. is arranged on the substrate below the low resistance fault protector. The resistance of the low resistance fault protector connected in series against low resistance defects in multiple units can be ignored. The high resistance fault protector has a sheet resistance of 50Ω/□, with different aspect ratios, and the corresponding equivalent resistance is 500Ω, 1000Ω, 5000Ω, 10000Ω. The short-circuit points are designed to have an equivalent impedance of A-0Ω, B-100Ω, C-500Ω, D-1000Ω and E-5000Ω, respectively. The experimental results are shown in the following table 2. The results show that, the low resistance fault protector designed against low resistance defect, with a resistance of less than 1000Ω, can effectively ensure stability of the panel, and can provide enough protection against defects having a resistance of less than 1000Ω. When the equivalent resistance of the defect is greater than 1000Ω, circuit breaking cannot occur under some conditions to isolate failed pixels, but failure current caused by the integral resistance of this pixel accounts for lower than 3%, and the normal operation current accounts for more than 97%, so the normal use mainly remain

TABLE 1

Experimental data in example 3

| Operation current | Short circuit prevention | Proportion of short circuit current % | | | | | Short circuit current mA | | | | |
|---|---|---|---|---|---|---|---|---|---|---|---|
| mA | resistance | Is-A | Is-B | Is-C | Is-D | Is-E | A | B | C | D | E |
| 10 | 500 | 54.34 | 49.79 | 37.30 | 28.40 | 9.76 | 5.492 | 5.033 | 3.771 | 2.871 | 0.987 |
| 10 | 1000 | 37.33 | 35.13 | 28.42 | 22.95 | 9.03 | 3.773 | 3.550 | 2.873 | 2.319 | 0.913 |
| 10 | 5000 | 10.72 | 10.54 | 9.84 | 9.10 | 5.67 | 1.084 | 1.065 | 0.995 | 0.920 | 0.573 |
| 10 | 10000 | 5.72 | 5.67 | 5.46 | 5.23 | 3.89 | 0.578 | 0.573 | 0.552 | 0.528 | 0.393 |
| 20 | 500 | 37.29 | 33.13 | 22.92 | 16.54 | 5.13 | 7.538 | 6.698 | 4.633 | 3.344 | 1.037 |
| 20 | 1000 | 22.93 | 21.29 | 16.56 | 12.95 | 4.73 | 4.637 | 4.305 | 3.347 | 2.619 | 0.955 |
| 20 | 5000 | 5.66 | 5.56 | 5.17 | 4.76 | 2.91 | 1.145 | 1.123 | 1.046 | 0.963 | 0.589 |
| 20 | 10000 | 2.94 | 2.91 | 2.81 | 2.68 | 1.98 | 0.595 | 0.589 | 0.567 | 0.542 | 0.401 |
| 30 | 500 | 28.38 | 24.83 | 16.54 | 11.67 | 3.48 | 8.607 | 7.528 | 5.015 | 3.538 | 1.055 |
| 30 | 1000 | 16.55 | 15.28 | 11.68 | 9.02 | 3.20 | 5.019 | 4.633 | 3.542 | 2.736 | 0.970 |
| 30 | 5000 | 3.85 | 3.77 | 3.51 | 3.23 | 1.96 | 1.166 | 1.144 | 1.064 | 0.978 | 0.595 |
| 30 | 10000 | 1.98 | 1.96 | 1.89 | 1.80 | 1.33 | 0.601 | 0.595 | 0.573 | 0.547 | 0.403 |

| Operation current | Short circuit prevention | Short-circuit current gain | | | | |
|---|---|---|---|---|---|---|
| mA | resistance | A | B | C | D | E |
| 10 | 500 | 422 | 387 | 290 | 221 | 76 |
| 10 | 1000 | 290 | 273 | 221 | 178 | 70 |
| 10 | 5000 | 83 | 82 | 77 | 71 | 44 |
| 10 | 10000 | 44 | 44 | 42 | 41 | 30 |
| 20 | 500 | 580 | 515 | 356 | 257 | 80 |
| 20 | 1000 | 357 | 331 | 257 | 201 | 73 |
| 20 | 5000 | 88 | 86 | 80 | 74 | 45 |
| 20 | 10000 | 46 | 45 | 44 | 42 | 31 |
| 30 | 500 | 662 | 579 | 386 | 272 | 81 |
| 30 | 1000 | 386 | 356 | 272 | 210 | 75 |
| 30 | 5000 | 90 | 88 | 82 | 75 | 46 |
| 30 | 10000 | 46 | 46 | 44 | 42 | 31 | unaffected. When a design mainly adopts high resistance fault protectors, the normal use of the panel can also be ensured if the failure current caused by defects accounts for lower than 1%. The two ends of the low resistance fault protector are connected with the auxiliary electrode and the high resistance fault protector, thereby ensuring effective protection against short circuit defects occurring in the area of the high resistance fault protector. It can only provide protection by the low resistance fault protector when the short-circuit defect occurs in the area of the high resistance fault protector and results in failure of the high resistance fault protector.

have an equivalent impedance of A-0Ω, B-100Ω, C-500Ω, D-1000Ω and E-5000Ω, respectively. The experimental results are shown in the following table 3. When the short circuit prevention resistance is 500Ω, the current through the short circuit point can vary significantly according to the different short circuit impedance. When the current is 1 to 11 mA, the low resistance fault protector designed against low resistance defects can allow to generate a short circuit current gain of more than 300, and work to break the circuit to isolate the defect area. When the equivalent resistance of the defect is too high, circuit breaking cannot occur to isolate the defect area, but the overall equivalent resistance of the

TABLE 2

Experimental data in example 4

| Operation current | Short circuit prevention | Proportion of short circuit current % | | | | | Current through defect point mA | | | | |
|---|---|---|---|---|---|---|---|---|---|---|---|
| mA | resistance | Is-A | Is-B | Is-C | Is-D | Is-E | A | B | C | D | E |
| 32 | 500 | 27.56 | 24.07 | 15.98 | 11.25 | 3.34 | 8.705 | 7.604 | 5.048 | 3.555 | 1.056 |
| 101 | 500 | 10.62 | 9.01 | 5.61 | 3.81 | 1.07 | 10.738 | 9.110 | 5.670 | 3.852 | 1.081 |
| 202 | 500 | 5.61 | 4.72 | 2.89 | 1.94 | 0.54 | 11.340 | 9.539 | 5.833 | 3.927 | 1.086 |
| 32 | 1000 | 16.00 | 14.76 | 11.26 | 8.69 | 3.08 | 5.053 | 4.661 | 3.558 | 2.746 | 0.972 |
| 101 | 1000 | 5.62 | 5.13 | 3.81 | 2.89 | 0.98 | 5.676 | 5.186 | 3.856 | 2.920 | 0.992 |
| 202 | 1000 | 2.89 | 2.63 | 1.94 | 1.47 | 0.49 | 5.839 | 5.322 | 3.931 | 2.962 | 0.997 |
| 32 | 5000 | 3.70 | 3.63 | 3.37 | 3.10 | 1.88 | 1.168 | 1.146 | 1.066 | 0.980 | 0.595 |
| 101 | 5000 | 1.19 | 1.16 | 1.08 | 0.99 | 0.60 | 1.198 | 1.175 | 1.091 | 1.001 | 0.603 |
| 202 | 5000 | 0.60 | 0.58 | 0.54 | 0.50 | 0.30 | 1.205 | 1.182 | 1.096 | 1.006 | 0.605 |
| 32 | 10000 | 1.90 | 1.88 | 1.81 | 1.73 | 1.28 | 0.601 | 0.595 | 0.573 | 0.548 | 0.403 |
| 101 | 10000 | 0.60 | 0.60 | 0.57 | 0.55 | 0.40 | 0.609 | 0.603 | 0.580 | 0.554 | 0.407 |
| 202 | 10000 | 0.30 | 0.30 | 0.29 | 0.27 | 0.20 | 0.611 | 0.605 | 0.582 | 0.555 | 0.408 |

| Operation current | Short circuit prevention | Current gain of short-circuit point | | | | |
|---|---|---|---|---|---|---|
| mA | resistance | A | B | C | D | E |
| 32 | 500 | 691 | 603 | 401 | 282 | 84 |
| 101 | 500 | 852 | 723 | 450 | 306 | 86 |
| 202 | 500 | 900 | 757 | 463 | 312 | 86 |
| 32 | 1000 | 401 | 370 | 282 | 218 | 77 |
| 101 | 1000 | 450 | 412 | 306 | 232 | 79 |
| 202 | 1000 | 463 | 422 | 312 | 235 | 79 |
| 32 | 5000 | 93 | 91 | 85 | 78 | 47 |
| 101 | 5000 | 95 | 93 | 87 | 79 | 48 |
| 202 | 5000 | 96 | 94 | 87 | 80 | 48 |
| 32 | 10000 | 48 | 47 | 45 | 43 | 32 |
| 101 | 10000 | 48 | 48 | 46 | 44 | 32 |
| 202 | 10000 | 48 | 48 | 46 | 44 | 32 |

Example 5

Short Circuit Protection for Large Sized Panel
(Current of Greater than 200 mA)

OLED panels herein used have a voltage of 6V and a current density for each pixel of 0.0126 mA. The number of pixels is 18000, 28000, 38000, respectively, and the corresponding area is 3250 mm² to 6860 mm². The low resistance fault protector is a metal conductive material with a melting point of 300° C., and has a conductor width of 1 un or a conductor thickness of 300 nm. An insulation material layer having a melting point of 200° C. is arranged on the substrate below the low resistance fault protector. The resistance of the low resistance fault protector connected in series against low resistance defects in multiple units can be ignored. The high resistance fault protector has a sheet resistance of 50Ω/□, with different aspect ratios, and the corresponding equivalent resistance is 500Ω, 1000Ω, 5000Ω, 10000Ω. The short-circuit points are designed to path is high enough so that the influenced photoelectric output of the panel is below 1%, thereby effectively increasing the reliability of the panel. When the resistance of the short circuit prevention high resistance fault protector is greater than 1000Ω, circuit breaking cannot occur under most defect conditions, but the short circuit current accounts for lower than 2%, even lower than 0.5%, so the reliability of the panel is increased. The two ends of the low resistance fault protector are connected with the auxiliary electrode and the high resistance fault protector, thereby ensuring effective protection against short circuit defects occurring in the area of the high resistance fault protector. It can only provide protection by the low resistance fault protector when the short-circuit defect occurs in the area of the high resistance fault protector and results in failure of the high resistance fault protector.

TABLE 3

Experimental data in example 5

| Operation current mA | Short circuit prevention resistance | Proportion of short circuit current % | | | | | Current through defect point mA | | | | |
|---|---|---|---|---|---|---|---|---|---|---|---|
| | | Is | Is | Is | Is | Is | A | B | C | D | E |
| 227 | 500 | 5.02 | 4.22 | 2.57 | 1.73 | 0.48 | 11.411 | 9.589 | 5.852 | 3.935 | 1.087 |
| 353 | 500 | 3.28 | 2.75 | 1.67 | 1.12 | 0.31 | 11.619 | 9.735 | 5.906 | 3.960 | 1.089 |
| 480 | 500 | 2.44 | 2.04 | 1.24 | 0.83 | 0.23 | 11.720 | 9.806 | 5.932 | 3.971 | 1.090 |
| 227 | 1000 | 2.58 | 2.35 | 1.73 | 1.30 | 0.44 | 5.858 | 5.338 | 3.939 | 2.967 | 0.998 |
| 353 | 1000 | 1.67 | 1.52 | 1.12 | 0.84 | 0.28 | 5.912 | 5.383 | 3.964 | 2.981 | 0.999 |
| 480 | 1000 | 1.24 | 1.13 | 0.83 | 0.62 | 0.21 | 5.938 | 5.405 | 3.975 | 2.988 | 1.000 |
| 227 | 5000 | 0.53 | 0.52 | 0.48 | 0.44 | 0.27 | 1.206 | 1.183 | 1.097 | 1.006 | 0.605 |
| 353 | 5000 | 0.34 | 0.33 | 0.31 | 0.28 | 0.17 | 1.209 | 1.185 | 1.099 | 1.008 | 0.605 |
| 480 | 5000 | 0.25 | 0.25 | 0.23 | 0.21 | 0.13 | 1.210 | 1.186 | 1.100 | 1.008 | 0.606 |
| 227 | 10000 | 0.27 | 0.27 | 0.26 | 0.24 | 0.18 | 0.611 | 0.605 | 0.582 | 0.556 | 0.408 |
| 353 | 10000 | 0.17 | 0.17 | 0.16 | 0.16 | 0.12 | 0.612 | 0.606 | 0.583 | 0.556 | 0.408 |
| 480 | 10000 | 0.13 | 0.13 | 0.12 | 0.12 | 0.08 | 0.612 | 0.606 | 0.583 | 0.556 | 0.408 |

| Operation current mA | Short circuit prevention resistance | Current gain of short-circuit point | | | | |
|---|---|---|---|---|---|---|
| | | A | B | C | D | E |
| 227 | 500 | 906 | 761 | 464 | 312 | 86 |
| 353 | 500 | 922 | 773 | 469 | 314 | 86 |
| 480 | 500 | 930 | 778 | 471 | 315 | 86 |
| 227 | 1000 | 465 | 424 | 313 | 235 | 79 |
| 353 | 1000 | 469 | 427 | 315 | 237 | 79 |
| 480 | 1000 | 471 | 429 | 316 | 237 | 79 |
| 227 | 5000 | 96 | 94 | 87 | 80 | 48 |
| 353 | 5000 | 96 | 94 | 87 | 80 | 48 |
| 480 | 5000 | 96 | 94 | 87 | 80 | 48 |
| 227 | 10000 | 48 | 48 | 46 | 44 | 32 |
| 353 | 10000 | 49 | 48 | 46 | 44 | 32 |
| 480 | 10000 | 49 | 48 | 46 | 44 | 32 |

Obviously, the above examples are merely for the purpose of clear illustration but not for limiting the mode of embodiments. For ordinary skilled in the art, other modifications or variation may be made on the basis of the above description, and any obvious changes or variations arising therefrom are within the protection scope of the present invention.

What is claimed is:

1. A highly stable organic light-emitting panel, comprising a substrate and a plurality of pixelated OLED circuit assemblies,
    wherein the substrate is further provided with an auxiliary electrode, an insulator and a plurality of circuit protection structures,
    wherein each of the plurality of circuit protection structures is electrically connected to a corresponding pixelated first electrode in each of the plurality of OLED circuit assemblies, and the plurality of circuit protection structures are respectively electrically connected to the auxiliary electrode,
    wherein the insulator covers the auxiliary electrode, the plurality of circuit protection structures and an area between the plurality of circuit protection structures and the plurality of OLED circuit assemblies; and
    wherein when a current passing through a pixel with short-circuit defect in any one of the plurality of OLED circuit assemblies is greater than a predetermined fusing threshold value of the circuit protection structure, the circuit protection structure corresponding to the pixel with short-circuit defect is adapted to fuse, thereby isolating the OLED circuit assembly corresponding to the pixel with short-circuit defect from the OLED circuit assembly corresponding to a normal working pixel.

2. The highly stable organic light-emitting panel according to claim 1, wherein a normal working pixel in each of the plurality of OLED circuit assemblies has an average current of J, and the predetermined fusing threshold value of each of the circuit protection structures is at least 100 times the average current J of the normal working pixel.

3. The highly stable organic light-emitting panel according to claim 2, wherein the predetermined fusing threshold value of each of the circuit protection structures is at a level of $10^2$ J to $10^3$ J.

4. The highly stable organic light-emitting panel according to any one of claim 3, wherein the substrate is provided with at least 100 pixelated OLED circuit assemblies.

5. The highly stable organic light-emitting panel according to claim 4, wherein the circuit protection structure is a fuse, and two ends of the fuse are respectively connected with the auxiliary electrode and the pixelated first electrode in the OLED circuit assembly, and when a pixel with short-circuit defect occurs, the fuse corresponding to the pixel with short-circuit defect reaches a fusing threshold value.

6. The highly stable organic light-emitting panel according to claim 5, wherein a short circuit current passing through the fuse has a density of at least greater than $10^{11}$ mA/cross-sectional area (m$^2$); wherein the cross-sectional area is the product of a width and a thickness of the fuse, and the width and thickness are the distance perpendicular to the current direction.

7. The highly stable organic light-emitting panel according to claim 6, wherein when the fuse reaches a circuit fusing condition, an average power consumption per unit length L(μm) of the fuse is greater than $10^{-3}$ joules, and wherein the average power consumption per unit length is calculated according to the following formula:

$$Q=(I_s^2 * R/L) * T$$

wherein $I_s$ represents the current of pixel with short circuit,

R represents a resistance value of the fuse,

L represents a length of the fuse in the current direction, measured in μm, and

T represents the action time before the circuit fuses, measured in seconds.

8. The highly stable organic light-emitting panel according to claim 7, wherein an influence area of thermal energy generated when the fuse reaches the circuit fusing condition is a circular area with a diameter of less than 200 μm based on the center of the fusing.

9. The highly stable organic light-emitting panel according to claim 1, wherein each of the circuit protection structures is connected in series with a second resistance protector, the circuit protection structure is adapted to provide protection to the panel when a pixel with short-circuit defect occurs due to low resistance fault in a pixelated load circuit connected in series with the circuit protection structure, and the second resistance protector is adapted to provide protection to the panel when a pixel with short-circuit defect occurs due to medium/high resistance fault in the pixelated OLED circuit assembly;

wherein each of the circuit protection structures is integrally molded with the second resistance protector.

10. The highly stable organic light-emitting panel according to claim 9, wherein the load comprises at least one second resistance protector and/or at least one pixelated OLED circuit assembly.

11. The highly stable organic light-emitting panel according to claim 9, wherein the circuit protection structure is a low resistance fault protector electrically connected with the auxiliary electrode, and when a current passing through a pixel with short-circuit defect caused by low resistance fault is greater than the predetermined fusing threshold value of the circuit protection structure, the circuit protection structure corresponding to the pixel with short-circuit defect is capable to fuse, thereby isolating the OLED circuit assembly corresponding to the pixel with short-circuit defect from OLED circuit assembly corresponding to normal working pixel.

12. The highly stable organic light-emitting panel according to claim 11, wherein the circuit protection structure is a metal conductor, a metal oxide conductor or a metal/metal oxide composite material, and has a conductor width of 0.1 μm to 10 μm and a conductor thickness of 10 nm to 1000 nm.

13. The highly stable organic light-emitting panel according to claim 12, wherein the circuit protection structure is a metal conductive material with a melting point of less than 800° C., a conductor width of 1 μm to 10 μm and a conductor thickness of 10 nm to 300 nm.

14. The highly stable organic light-emitting panel according to claim 11, wherein an insulating material layer with a melting point of less than 400° C. is arranged on the substrate below the circuit protection structure.

15. The highly stable organic light-emitting panel according to claim 14, wherein the predetermined fusing threshold value of each of the plurality of circuit protection structures is 5 mA or is a value which generates a short-circuit current gain of greater than 300.

16. The highly stable organic light-emitting panel according to claim 15, wherein the predetermined fusing threshold value of each of the plurality of circuit protection structures is a value which generates a short-circuit current gain of greater than 1000.

17. The highly stable organic light-emitting panel according to claim 11, wherein the second resistance protector is a high resistance fault protector and is electrically connected with the pixelated first electrode of the OLED circuit assembly, and is capable of providing protection when a fault impedance is between a maximum impedance of the pixel with short-circuit defect caused by the low resistance fault and an equivalent impedance of a normal working pixelated OLED circuit assembly.

18. The highly stable organic light-emitting panel according to claim 17, wherein the high resistance fault protector is a metal or metal oxide having a sheet resistance of 10-100Ω/□ and having an aspect ratio to allow the circuit protection structure to have a resistance of 400-20000Ω, and the high resistance fault protector has a voltage consumption which is less than 10% of the operation voltage of a panel.

19. The highly stable organic light-emitting panel according to claim 18, wherein when short-circuit defect occurs in a pixel due to a high resistance fault in any one of the pixelated OLED circuit assemblies but the generated short-circuit current gain is smaller than 300 or the short-circuit current is smaller than 5 mA, the circuit protection structure corresponding to the pixel with short-circuit defect shall not fuse and the panel shall maintain normal photoelectric characteristic output.

20. The highly stable organic light-emitting panel according to claim 9, wherein the circuit protection structure and the second resistance protector are made of same or different conductive materials, and wherein the circuit protection structure has a cross-sectional area perpendicular to the current direction, the second resistance protector has a cross-sectional area perpendicular to the current direction, and the cross-sectional area of the circuit protection structure is less than the cross-sectional area of the second resistance protector.

* * * * *